(12) United States Patent
Lin et al.

(10) Patent No.: US 10,170,403 B2
(45) Date of Patent: Jan. 1, 2019

(54) AMELIORATED COMPOUND CARRIER BOARD STRUCTURE OF FLIP-CHIP CHIP-SCALE PACKAGE

(71) Applicant: KINSUS INTERCONNECT TECHNOLOGY CORP., Taoyuan County (TW)

(72) Inventors: Ting-Hao Lin, Taoyuan County (TW); Chiao-Cheng Chang, Taoyuan County (TW); Yi-Nung Lin, Taoyuan County (TW)

(73) Assignee: Kinsus Interconnect Technology Corp., Taoyuan County (TW)

( * ) Notice: Subject to any disclaimer, the term of this patent is extended or adjusted under 35 U.S.C. 154(b) by 246 days.

(21) Appl. No.: 14/572,904

(22) Filed: Dec. 17, 2014

(65) Prior Publication Data

US 2016/0181188 A1    Jun. 23, 2016

(51) Int. Cl.
*H01L 23/498* (2006.01)

(52) U.S. Cl.
CPC .. *H01L 23/49827* (2013.01); *H01L 23/49833* (2013.01); *H01L 23/49816* (2013.01); *H01L 2224/16225* (2013.01); *H01L 2224/32225* (2013.01); *H01L 2224/73204* (2013.01); *H01L 2924/0002* (2013.01); *H01L 2924/15311* (2013.01)

(58) Field of Classification Search
CPC ......... H01L 23/49816; H01L 23/49827; H01L 23/49833; H01L 2224/16225; H01L 2224/32225; H01L 2224/73204; H01L 2924/0002; H01L 2924/15311
See application file for complete search history.

(56) References Cited

U.S. PATENT DOCUMENTS

| 5,521,435 | A |   | 5/1996 | Mizukoshi |           |
|-----------|---|---|--------|-----------|-----------|
| 5,903,056 | A | * | 5/1999 | Canning   | H01L 24/32 |
|           |   |   |        |           | 257/746   |
| 6,734,535 | B1| * | 5/2004 | Hashimoto | H01L 23/13 |
|           |   |   |        |           | 257/668   |

(Continued)

*Primary Examiner* — Steven T Sawyer
*Assistant Examiner* — Paresh Paghadal
(74) *Attorney, Agent, or Firm* — Juan Carlos A. Marquez; Marquez IP Law Office, PLLC

(57) ABSTRACT

An ameliorated compound carrier board structure of Flip-Chip Chip-Scale Package has the insulating layer between the carrier board and the substrate in the prior art replaced by an anisotropic conductive film or materials with similar structure. The anisotropic conductive film has conductive particles therein to replace the conductive openings on the insulating layer in the prior art. When compressing the substrate onto the carrier board, the bottom surface of the second electrode pads are compressing the corresponding conductive particles on the second electrical contact pads, causing which to burst, therefore forming high-density compressed areas that conduct the second electrode pads and the second electrical contact pads; the conductive particles outside the high-density compressed area are not burst, forming an insulating film between the substrate and the carrier board; in other words, the anisotropic conductive film provides conduction in a Z direction. The structure can avoid the inaccuracies of distance and size of the conductive openings and the inaccuracy of the contact between the second electrode pads and the second electrical contact pads.

8 Claims, 7 Drawing Sheets

(56) References Cited

U.S. PATENT DOCUMENTS

| | | | | |
|---|---|---|---|---|
| 7,573,198 B2* | 8/2009 | Hwang | | H01J 11/12 |
| | | | | 313/582 |
| 2001/0046021 A1* | 11/2001 | Kozuka | | C09J 9/02 |
| | | | | 349/150 |
| 2002/0100974 A1* | 8/2002 | Uchiyama | | H01L 24/13 |
| | | | | 257/737 |
| 2006/0138638 A1* | 6/2006 | Komatsu | | H01L 21/486 |
| | | | | 257/700 |
| 2006/0154395 A1* | 7/2006 | Kim | | B32B 17/04 |
| | | | | 438/30 |
| 2007/0132536 A1* | 6/2007 | Lee | | H01L 23/5389 |
| | | | | 336/200 |
| 2008/0231789 A1* | 9/2008 | Kurasawa | | G02F 1/13452 |
| | | | | 349/139 |
| 2009/0236130 A1* | 9/2009 | Mok | | H05K 3/4608 |
| | | | | 174/257 |
| 2010/0148359 A1* | 6/2010 | Quevedo | | H01L 23/49816 |
| | | | | 257/725 |
| 2011/0061905 A1* | 3/2011 | Hwang | | H05K 1/0271 |
| | | | | 174/255 |
| 2011/0241193 A1* | 10/2011 | Ding | | H01L 21/6835 |
| | | | | 257/686 |
| 2013/0075140 A1* | 3/2013 | Amano | | H05K 3/4602 |
| | | | | 174/257 |
| 2013/0161836 A1* | 6/2013 | Yeom | | H01L 25/105 |
| | | | | 257/778 |
| 2013/0187723 A1* | 7/2013 | Harima | | H03B 5/36 |
| | | | | 331/158 |
| 2014/0182892 A1* | 7/2014 | Hsu | | H05K 1/186 |
| | | | | 174/251 |
| 2014/0318834 A1* | 10/2014 | Tsuchida | | H05K 1/036 |
| | | | | 174/255 |
| 2015/0061095 A1* | 3/2015 | Choi | | H01L 24/20 |
| | | | | 257/675 |
| 2015/0228617 A1* | 8/2015 | Lee | | H01L 24/83 |
| | | | | 257/772 |
| 2016/0381801 A1* | 12/2016 | Saruyama | | H01R 4/04 |
| | | | | 361/767 |

* cited by examiner

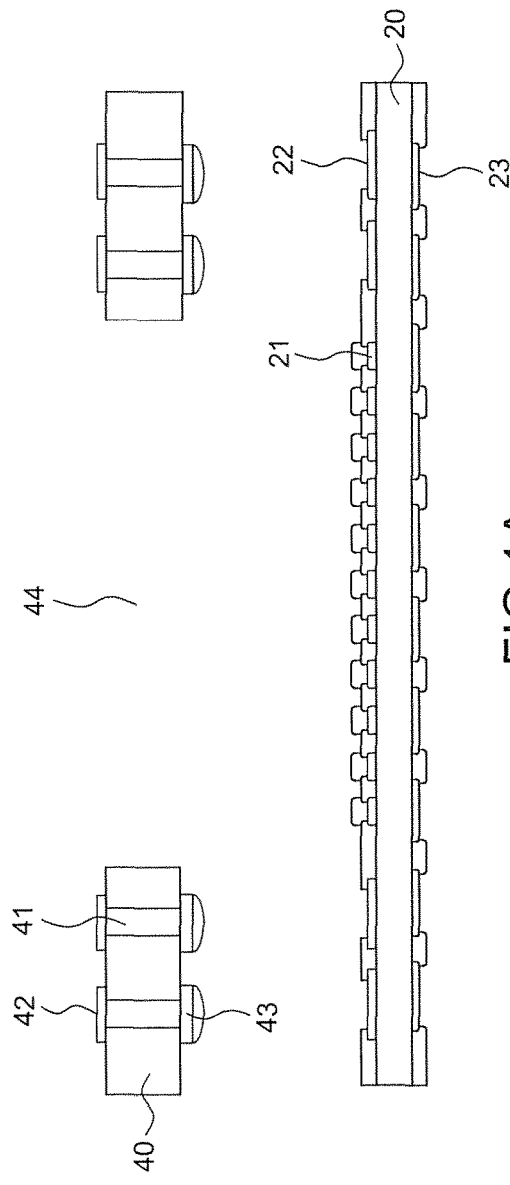
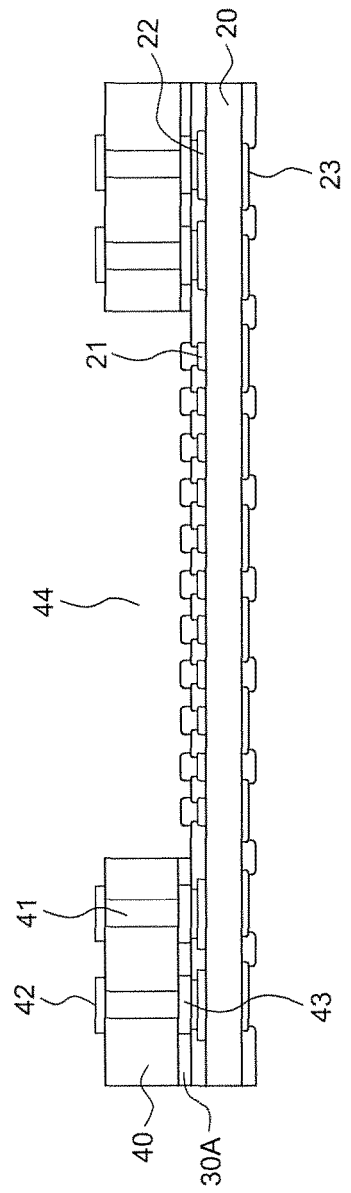
FIG. 1A
PRIOR ART
FIG. 1B
PRIOR ART

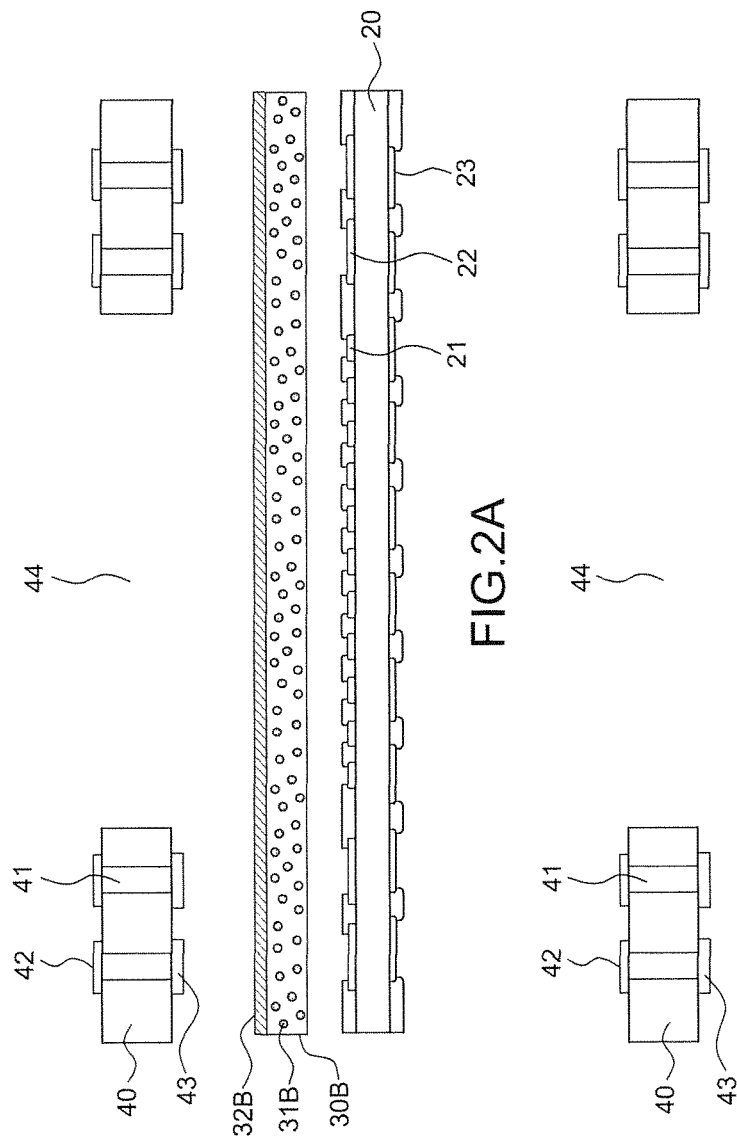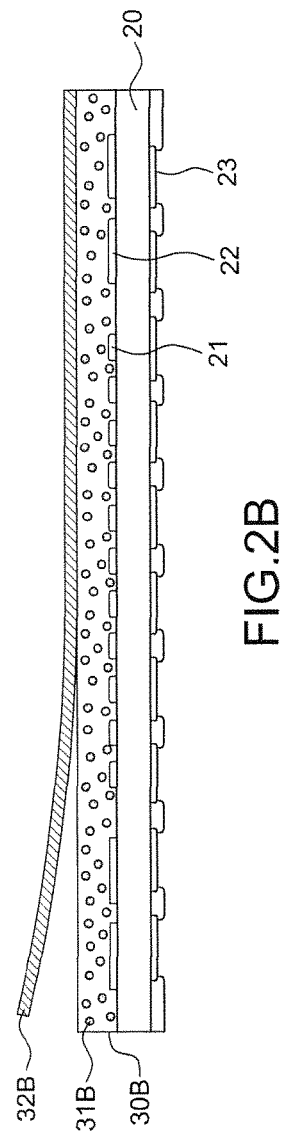
FIG.2A
FIG.2B

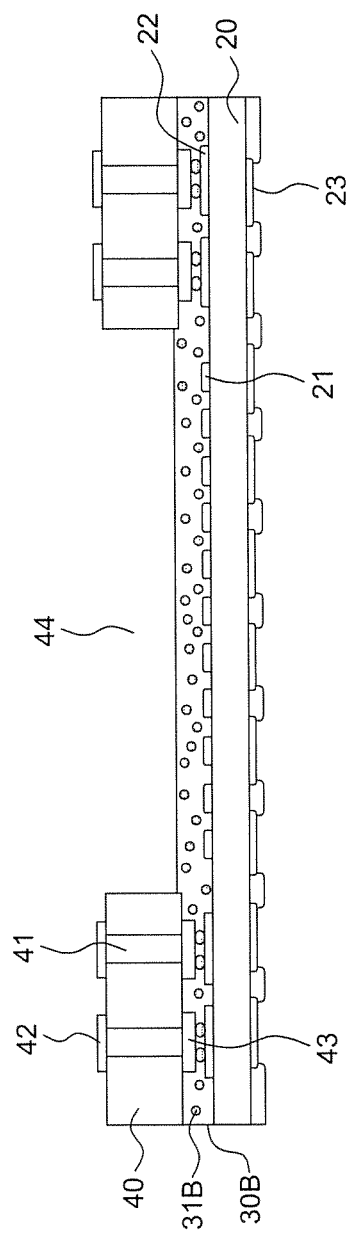
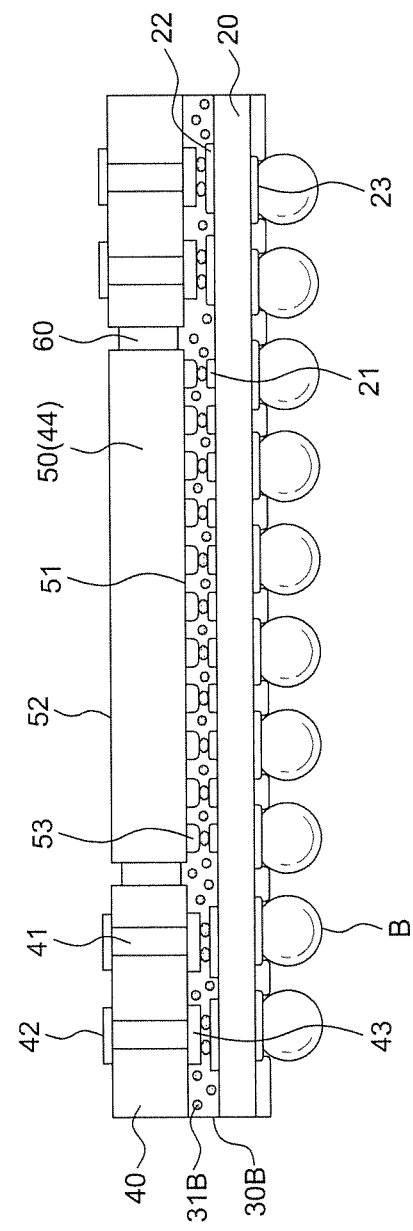

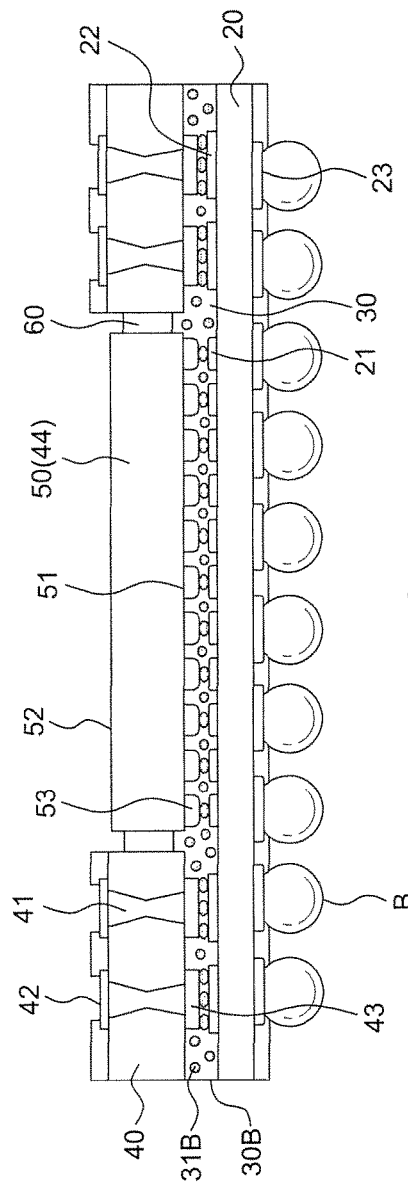
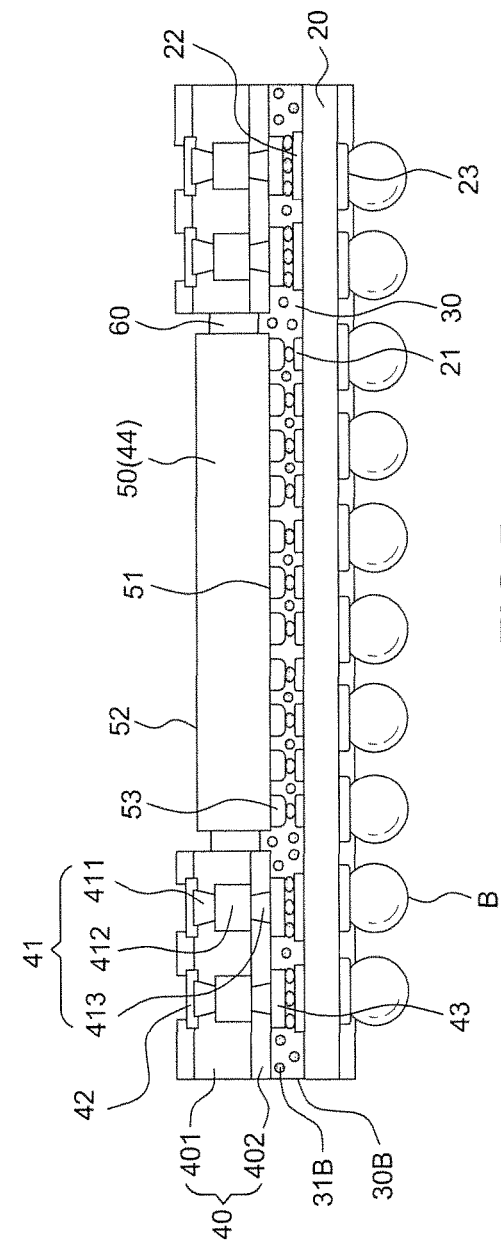

AMELIORATED COMPOUND CARRIER BOARD STRUCTURE OF FLIP-CHIP CHIP-SCALE PACKAGE

BACKGROUND OF THE INVENTION

1. Field of the Invention

The present invention relates to an ameliorated compound carrier board structure of Flip-Chip Chip-Scale Package that has the insulating layer between the carrier board and the substrate in the prior art replaced by an anisotropic conductive film or materials with similar structure. The anisotropic conductive film has conductive particles therein to replace the plurality of conductive openings manufactured on the insulating layer in the prior art so as to avoid the inaccuracies of distance and size of the conductive openings and the inaccuracy of the contact between the second electrode pads and the second electrical contact pads operated manually.

2. Description of the Related Art

The structure of a Flip-Chip Chip-Scale Package as shown in FIGS. 1A~1D is from Taiwan application No. 102121661 (U.S. application Ser. No. 13/938,335) which has not been published yet. The structure is a three dimension package technology strides toward high-power, high-density, lightweight and miniaturized communication products. It can also be the main structure of Package on Package (POP) to bond with other packages or a PCB. Basically the manufacturing of the structure can be divided into two stages: carrier board stage and package stage.

FIGS. 1A and 1B are schematic diagrams before and after bonding the carrier board and the substrate which belongs to the carrier stage and has the manufacturing process as following:

a) providing a carrier board 20 on the upper surface of which a plurality of first electrical contact pads 21 and second electrical contact pads 22 are arranged as the second electrical contact pads 22 surrounding the first electrical contact pads 21, and under the bottom surface of which a plurality of third electrical contact pads 23 are arranged;

b) providing a substrate 40 having a plurality of electric conductors 41 penetrating through; the upper and lower ends of each is exposed on the top and bottom surface of the substrate 40 and is electrically connected to the bottom surface of a first electrode pad 42 and the top surface of a second electrode pad 43. The substrate 40 also has a flip region 44 with a penetrable opening for an insulating layer 30A to be pasted thereunder. The bottom surface of the second electrode pads 43 are arranged correspondingly to the top surface of the second electrical contact pads 22 for the latter to be electrically connected to the former; and the first electrical contact pads 21 is disposed in the flip region 44, bonding the insulating layer 30A with the carrier board 20 and forming the compound structure.

FIGS. 1C and 1D are schematic of a completed package manufactured by the Flip-Chip Chip-Scale package process. The process is as follows:

c) providing at least one die 50 having an active surface 51 and a non-active surface 52 arranged correspondingly; the active surface 51 has a plurality of bumps 53 contacting the first electrical contact pads 21, and a sealant material 60 is filled in the gap between the flip region 44 and the die 50 for the latter to be fixed in the flip region 44, rendering the non-active surface 52 an exposed status and providing an adhesive for a solder ball B to adhere to a third electrical contact pad 23.

With structures disclosed, when the die 50 is hot-pressed during the manufacturing process, the heat is generated in the flip region 44. The substrate 40 with low Coefficient of thermal expansion is able to withstand the thermal stress caused by the thermal conduction to avoid a thermal expansion arising from the thermal convection focused on the carrier board 20 while the substrate 40, insulating layer 30A, and compound structure are able to withstand the thermal stress. At the same time, an open area above the flip region 44 is able to accelerate the thermal convection. Thus, through the well thermal conduction and convection, the heat generated by the carrier board 20 during the process can be rapidly eliminated, solving the problem of the curving carrier board 20 due to thermal stresses; the structure therefore has the thin feature and effectiveness of mechanical enhancement, heat dissipating enhancement and less curving.

The main function of the insulating layer 30A is to insulate the bottom surface of the substrate 40 and the upper surface of the carrier board 20. However, there are still problems to be solved.

Firstly, the distance and size of the conductive openings (not shown) on the insulating layer 30A has to be manufactured by machines, increasing the prime costs and causing inaccuracies of the contact area between the substrate 40 and the carrier board 20 which may affect the insulating function when the inaccuracies are way too huge.

Secondly, when placing the insulating layer 30A, the position of the conductive openings between the second electrical contact pads 22 and the second electrode pads 43 have to be determined manually, increasing the manufacture time and possibly affect the measure of the contact area in-between. In other words, the inaccuracies of distance, size, and corresponding position of each conductive opening would result in inaccuracy of the contact area and further affect the insulating function. Therefore, there is still room for improvements.

SUMMARY OF THE INVENTION

The primary object of the present invention is to replace the manually manufactured conductive openings on the insulating layer in the prior art by the conductive particles in an anisotropic conductive film in order to avoid the inaccuracies of distance, size, and corresponding position of each conductive opening, so as to achieve a more convenient and faster manufacture process with better insulation.

To achieve the object mentioned above, the present invention comprises a carrier board having a plurality of first electrical contact pads and second electrical contact pads arranged as the second electrical contact pads surrounding the first electrical contact pads; a substrate with a flip region having a penetrable opening and being arranged correspondingly to the first electrical contact pads, and a plurality of electric conductors penetrating through as the upper and lower ends of each being exposed on the top and bottom surface of the substrate and being electrically connected to the bottom surface of a first electrode pad and the top surface of a second electrode pad; the bottom surface of the second electrode pads are arranged correspondingly to the top surface of the second electrical contact pads; and an anisotropic conductive film having a plurality of conductive particles therein and being compressed onto the carrier board, then having the substrate compressing thereon, allowing the bottom surface of the second electrode pads compressing the corresponding conductive particles, causing which to burst and contact with the top surface of the second electrical contact pads and therefore forming high-density compressed areas for conducting the second electrode pads and the second electrical contact pads while the conductive particles outside the high-density compressed areas that are not burst form an insulating film between the bottom surface of the substrate and the top surface of the carrier board.

With the structure disclosed above, the thickness of the anisotropic conductive film is between 30 μm and 40 μm, and the conductive particles are nickel- and gold-plated particles with a diameter of 5 μm, the density between each is 2500~5000 pcs/mm$^2$; the anisotropic conductive film is compressed onto the carrier board under the process parameters of 70° C.~90° C., 1 MPa, and 1 second, then the substrate is compressed thereon under the process parameters of 150° C.~220° C., 2~4 MPa, and 1~10 seconds; Each second electrode pad has a distance within 50 μm with other ones so that the conductive particles between the bottom surface of the second electrode pads and the top surface of the second electrical contact pads would have a contact area of at least 50000 μm with the conductive particles.

Furthermore, the electric conductors are arranged in through-hole shapes which can be symmetrical frustums with wider upper and lower ends; the substrate is formed by the combination of a first layer and a second layer. The electric conductors have the upper part thereof arranged in a blind-hole shape, the middle part thereof a buried-hole shape, and the lower part thereof a blind-hole shape; the upper part and middle part thereof are disposed in the first layer and the lower part thereof in the second layer; each electric conductor includes a first conductor arranged in a blind-hole shape and a second conductor arranged in a semi-through-hole shape; the first conductor is in the first layer and the second conductor is between the first and second layer.

The present invention can further include at least one die having an active surface and a non-active surface arranged correspondingly with the active surface having a plurality of bumps, the bottom surface of which can compress the conductive particles on the first electrical contact pads to conduct, and a sealant material is filled in the gap between the flip region and the die for the latter to be fixed in the flip region, rendering the non-active surface an exposed status.

With the structures disclosed above, the present invention has the conventional insulating layer replaced by the anisotropic conductive film which has conductive particles therein to replace a plurality of conductive openings manufactured on the insulating layer. Such improvement can reduce the costs and time for manufacture process and also avoid the inaccuracies of distance, size, and corresponding position of each conductive opening, so as to precisely locate the contact surface of the second electrode pads and the second electrical contact pads and provide better insulation.

BRIEF DESCRIPTION OF THE DRAWINGS

FIG. 1A is a schematic diagram of a carrier board and a substrate before bonding according to the prior art;

FIG. 1B is a schematic diagram of the carrier board and the substrate after bonding according to the prior art;

FIG. 2A is a schematic diagram of the present invention before the bonding of the carrier board, the anisotropic conductive film, and the substrate;

FIG. 2B is a schematic diagram of the present invention illustrating the anisotropic conductive film being compressed onto the carrier board;

FIG. 2C is a schematic diagram of the present invention illustrating the substrate being compressed onto the anisotropic conductive film and the carrier board;

FIG. 2D is a schematic diagram illustrating the structure of the present invention in an applicable embodiment;

FIG. 4 is a schematic diagram illustrating the structure of the present invention in another applicable embodiment;

FIG. 5 is a schematic diagram illustrating yet another applicable embodiment of the present invention.

DETAILED DESCRIPTION OF THE PREFERRED EMBODIMENT

Figure 1C:
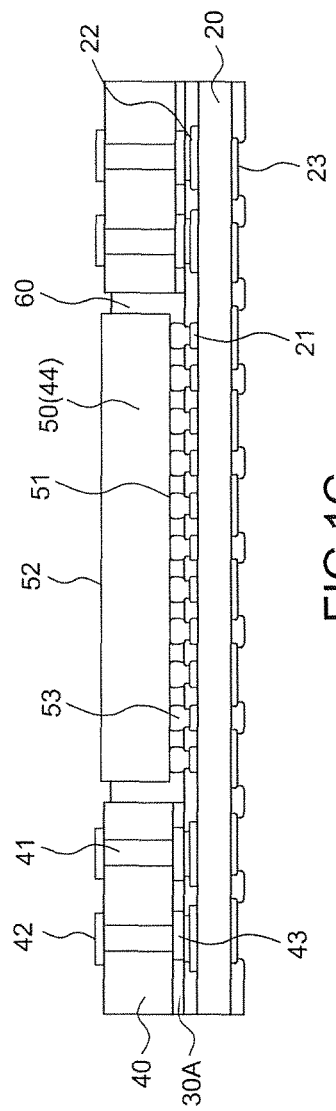
FIG. 1C is a schematic diagram of a completed package according to the prior art.
Figure 1D:
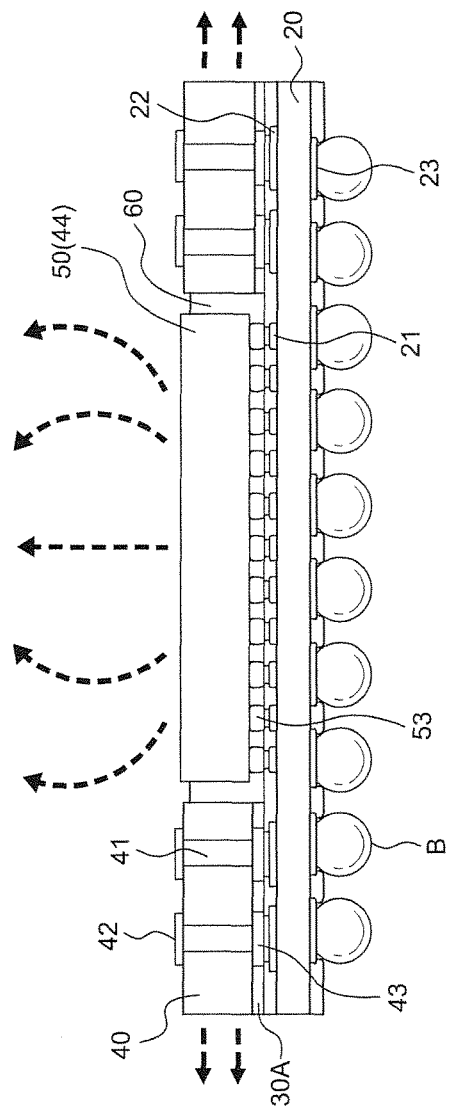
FIG. 1D is a schematic diagram illustrating the heat conduction and convection of the completed package according to the prior art.
Figure 3A:
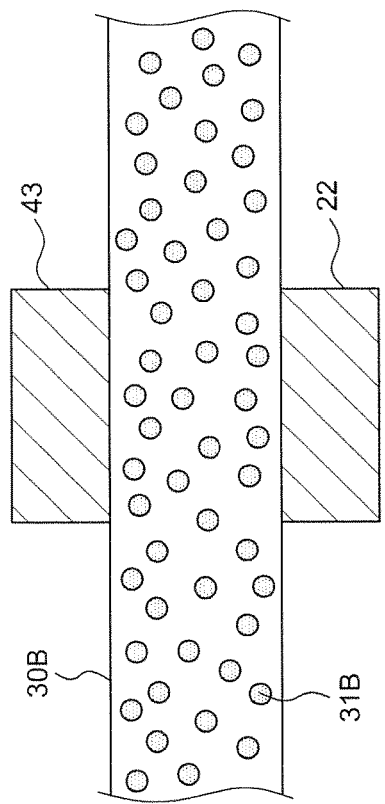
FIG. 3A is a schematic diagram illustrating the anisotropic conductive film of the present invention before compression.
Figure 3B:
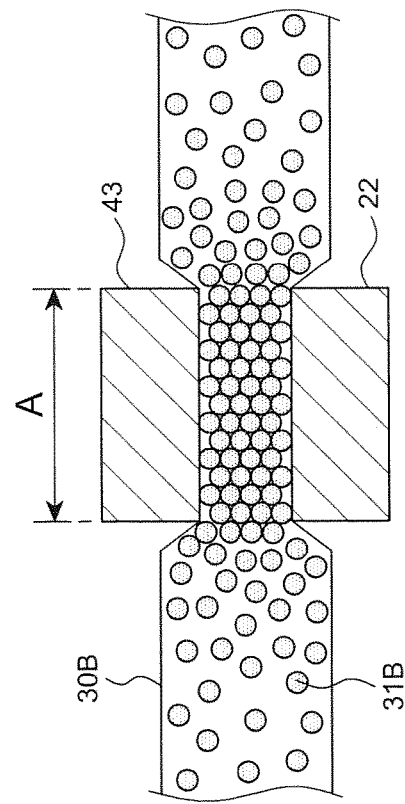
FIG. 3B is a schematic diagram illustrating the anisotropic conductive film of the present invention after compression.

Firstly, referring to FIGS. 2A~2D and 3A~3B, in a preferred embodiment the present invention comprises a carrier board 20, a substrate 40, and an anisotropic conductive film 30B.

The carrier board 20 has a plurality of first electrical contact pads 21 and second electrical contact pads 22 arranged as the second electrical contact pads 22 surrounding the first electrical contact pads 21.

The substrate 40 has a flip region 44 with a penetrable opening arranged correspondingly to the first electrical contact pads 21 and a plurality of electric conductors 41 penetrating through as the upper and lower ends of each being exposed on the top and bottom surface of the substrate 40 and being electrically connected to the bottom surface of a first electrode pad 42 and the top surface of a second electrode pad 43. The bottom surface of the second electrode pads 43 are corresponding to the top surface of the second electrical contact pads 22.

The anisotropic conductive film 30B has a plurality of conductive particles 31B therein and is compressed onto the carrier board 20, then it has the substrate 40 compressing thereon, allowing the bottom surface of the second electrode pads 43 compressing the corresponding conductive particles 31B, causing which to burst and contact with the top surface of the second electrical contact pads 22 and therefore forming high-density compressed areas A for conducting the second electrode pads 43 and the second electrical contact pads 22, while the conductive particles 31B outside the high-density compressed areas A that are not burst form an insulating film between the bottom surface of the substrate 40 and the top surface of the carrier board 20. In this embodiment, the anisotropic conductive film 30B has a protective film 32B pasted thereon to be torn off after being compressed on the carrier board 20, then the substrate 40 is compressed thereon. But the present invention is not limited to such application.

After bonding the carrier board 20, the anisotropic conductive film 30B and the substrate 40, a set of preferred process parameters are set to ensure insulation. For instance, the thickness of the anisotropic conductive film 30B is between 30 μm and 40 μm, and the conductive particles 31B are nickel- and gold-plated particles with a diameter of 5 μm and the density between each is 2500~5000 pcs/mm$^2$; the anisotropic conductive film 30B is compressed onto the carrier board 20 under the process parameters of 70° C.~90° C., 1 MPa, and 1 second, then the substrate 40 is compressed thereon under the process parameters of 150° C.~220° C., 2~4 MPa, and 1~10 seconds; Each second electrode pad 43 has a distance within 50 μm with other ones so that the conductive particles 31B between the bottom surface of the second electrode pads 43 and the top surface of the second electrical contact pads 22 would have a contact area of at least 50000 μm with the conductive particles 31B.

Furthermore, in an applicable embodiment, the material of the substrate 40 has low Coefficient of thermal expansion, or it could be a carbon composite substrate or a ceramic substrate so that the thin carrier board 20 of thickness less than 150 μm would not easily curve due to the heat. The flip region 44 has a die 50 inserted therein which has an active surface 51 and a non-active surface 52 arranged correspondingly as the active surface 51 having a plurality of bumps 53, the bottom surface of which can compress the conductive particles 31B on the first electrical contact pads 21 to conduct, and a sealant material 60 is filled in the gap in the flip region 44 about the die 50 for the latter to be fixed in the flip region 44, keeping the non-active surface 52 an exposed state and providing an adhesive for a solder ball B to adhere to a third electrical contact pad 23.

In addition, in an applicable embodiment, the substrate 40 is a dot-matrix board so that it can be a single layer or a multilayer bonded by different materials. The inside of the substrate 40 can have holes in through-hole, blind-hole, buried-hole, or semi-through-hole shape made by drilling tools or laser manufacturing; then the electric conductors 41 are filled in the holes by means of electroplating. The electric conductors 41 can be made of copper and are void free; therefore they can be in through-hole shape or different combinations of blind-hole, buried-hole, and semi-through-hole shapes to form different structure in accordance with the substrate 40; but it is not limited to such application.

FIG. 4 illustrates the structure of another applicable embodiment. The through-hole shape of the electric conductors 41 is a symmetrical frustum with wider upper and lower ends.

Another structure of an applicable embodiment of the present invention is shown in FIG. 5. The substrate 40 is formed by the combination of a first layer 401 and a second layer 402. The electric conductors 41 have an upper part 411 arranged in a blind-hole shape, a middle part 412 arranged in a buried-hole shape, and a lower part 413 arranged in a blind-hole shape; the upper part 411 and middle part 412 are disposed in the first layer 401 and the lower part 413 is in the second layer 402.

Figure 6:
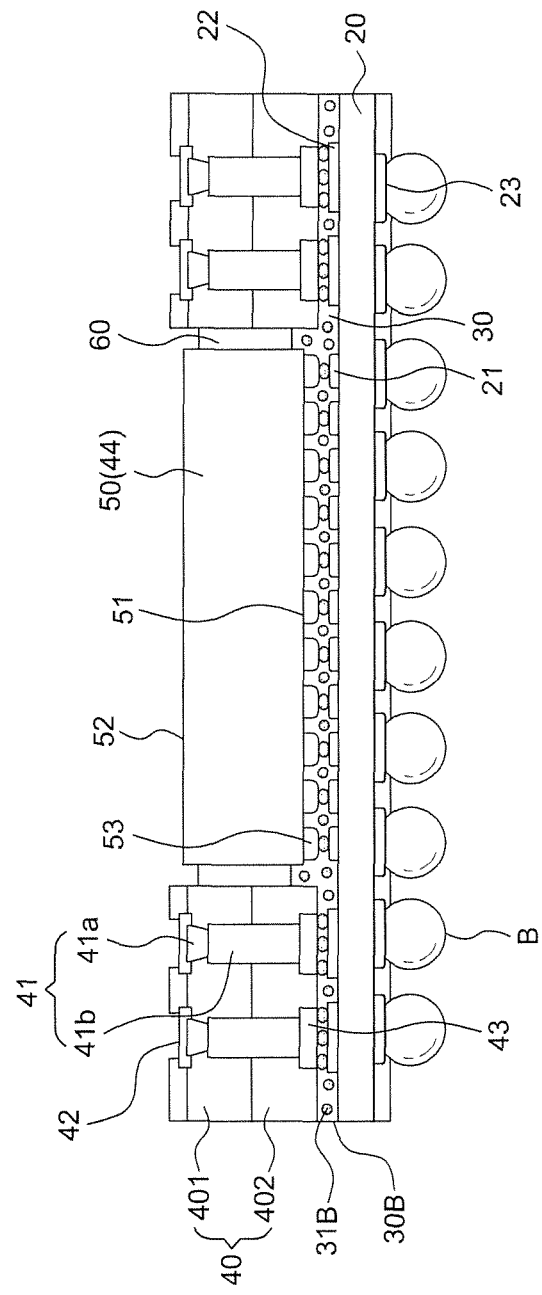
FIG. 6 is a schematic diagram illustrating still another applicable embodiment of the present invention.

Referring to FIG. 6, the structure of another applicable embodiment of the present invention, each electric conductor 41 includes a first conductor 41a arranged in a blind-hole shape and a second conductor 41b arranged in a semi-through-hole shape. The first conductor 41a is in the first layer 401 and the second conductor 41b is between the first and second layer 401, 402; and the thickness of the first and second layer 401, 402 in total is more than 250 μm but is not limited to such application.

In conclusion, the present invention has the anisotropic conductive film 30B replacing the conventional insulating layer 30A but still has the thin feature and effectiveness of mechanical enhancement, heat dissipating enhancement and less curving. Meanwhile, having the conductive particles 31B in the anisotropic conductive film 30B replacing the conductive openings manufactured on the insulating layer 30A in the prior art can also reduce the costs and time for manufacture process and provide better insulation.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:
1. An ameliorated compound carrier board structure of Flip-Chip Chip-scale Package comprising:
   a carrier board having a plurality of first electrical contact pads on a top surface of the carrier board, and a plurality of second electrical contact pads on the top surface of the carrier board and arranged surrounding the first electrical contact pads;
   a substrate having a flip region with a through opening arranged over the first electrical contact pads, and a plurality of electric conductors penetrating the substrate with the upper and lower ends of each being exposed on top and bottom surfaces of the substrate and being electrically connected to a bottom surface of a first electrode pad and a top surface of a second electrode pad; the bottom surface of the second electrode pads corresponding to the top surface of the second electrical contact pads; and
   an anisotropic conductive film including an insulating layer having a plurality of conductive particles distributed therein at mutually spaced positions, the anisotropic conductive film having portions compressed between the second electrode pads of the carrier board and the second electrical contact pads of the substrate to form a plurality of high-density compressed areas, the conductive particles within each of the high-density compressed areas thereby bursting and contacting with the top surface of the second electrical contact pads for conducting the second electrode pads and the second electrical contact pads, and the conductive particles outside the high-density compressed areas remaining unburst in position within the insulating layer to remain insulation of uncompressed portions of the insulating layer other than the high-density compressed areas between the bottom surface of the substrate and the top surface of the carrier board, and
   at least one die, disposed in the through opening, and having an active surface and a non-active surface arranged correspondingly with the active surface having a plurality of bumps, the bottom surface of each bump compressing a portion of the anisotropic conductive film against one of the first electrical contact pads to form a conductive connection therewith, a sealant material being filled in a gap between an inner wall of the through opening of the flip region and an outer peripheral of the die for the die to be fixed in the flip region, with the non-active surface remaining exposed;
   wherein the thickness of the anisotropic conductive film is between 30 μm and 40 μm, and the conductive particles are nickel- and gold-plated particles with a diameter of 5 μm; the anisotropic conductive film is compressed onto the carrier board under the process parameters of 70° C.~90° C. 1 MPa, and 1 second, then the substrate is compressed thereon under the process parameters of 150° C.~220° C., 2~4 MPa, and 1~10 seconds; each second electrode pad has a distance within 50 μm with other ones so that the conductive particles between the bottom surface of the second electrode pads and the top surface of the second electrical contact pads would have a contact area of at least 50000 μm with the conductive particles.

2. The ameliorated compound carrier board structure of Flip-Chip Chip-scale Package as claimed in claim 1, wherein the electric conductors are arranged in a through-hole shape.

3. The ameliorated compound carrier board structure of Flip-Chip Chip-scale Package as claimed in claim 2, wherein the through-hole shape is a symmetrical frustum with wider upper and lower ends.

4. The ameliorated compound carrier board structure of Flip-Chip Chip-scale Package as claimed in claim 1, wherein the substrate is formed by the combination of a first layer and a second layer.

5. The ameliorated compound carrier board structure of Flip-Chip Chip-scale Package as claimed in claim 4, wherein the electric conductors have the upper part thereof arranged in a blind-hole shape, the middle part thereof a buried-hole shape, and the lower part thereof a blind-hole shape; the upper part and middle part thereof are disposed in the first layer and the lower part thereof in the second layer.

6. The ameliorated compound carrier board structure of Flip-Chip Chip-scale Package as claimed in claim 4, wherein each electric conductor includes a first conductor arranged in a blind-hole shape and a second conductor arranged in a semi-through-hole shape; and, the first conductor is disposed in the first layer and the second conductor is disposed between the first and second layer.

7. The ameliorated compound carrier board structure of Flip-Chip Chip-scale Package as claimed in claim 6, wherein the substrate is a dot-matrix board, a board with low Coefficient of Thermal Expansion, a carbon composite substrate, or a ceramic substrate.

8. An ameliorated compound carrier board structure of Flip-Chip Chip-scale Package comprising:
a carrier board having a plurality of first electrical contact pads on a top surface of the carrier board, and a plurality of second electrical contact pads on the top surface of the carrier board and arranged surrounding the first electrical contact pads;
a substrate, which is selected from the group consisting of a dot-matrix board, a carbon composite substrate, and a combination thereof, disposed over the carrier board, and having a flip region with a through opening arranged over the first electrical contact pads, and a plurality of electric conductors penetrating the substrate with the upper and lower ends of each being exposed on top and bottom surfaces of the substrate and being electrically connected to a bottom surface of a first electrode pad and a top surface of a second electrode pad; the bottom surface of the second electrode pads corresponding to the top surface of the second electrical contact pads; and
an anisotropic conductive film including an insulating layer having a plurality of conductive particles distributed therein at mutually spaced positions, the anisotropic conductive film having portions compressed between the second electrode pads of the carrier board and the second electrical contact pads of the substrate to form a plurality of high-density compressed areas, the conductive particles within each of the high-density compressed areas thereby bursting and contacting with the top surface of the second electrical contact pads for conducting the second electrode pads and the second electrical contact pads, and the conductive particles outside the high-density compressed areas remaining unburst in position within the insulating layer to remain insulation of uncompressed portions of the insulating layer other than the high-density compressed areas between the bottom surface of the substrate and the top surface of the carrier board; and
at least one die, disposed in the through opening, and having an active surface and a non-active surface arranged correspondingly with the active surface having a plurality of bumps, the bottom surface of each bump compressing a portion of the anisotropic conductive film against one of the first electrical contact pads to form a conductive connection therewith, a sealant material being filled in a gap between an inner wall of the through opening of the flip region and an outer peripheral of the die for the die to be fixed in the flip region, with the non-active surface remaining exposed;
wherein:
the thickness of the anisotropic conductive film is between 30 μm and 40 μm, and the conductive particles are nickel- and gold-plated particles with a diameter of 5 μm;
the anisotropic conductive film is compressed onto the carrier board under the process parameters of 70° C.~90° C., 1 MPa, and 1 second, then the substrate is compressed thereon under the process parameters of 150° C.~220° C., 2~4 MPa, and 1~10 seconds;
each second electrode pad has a distance within 50 μm with other ones so that the conductive particles between the bottom surface of the second electrode pads and the top surface of the second electrical contact pads would have a contact area of at least 50000 μm with the conductive particles;
the substrate is formed by the combination of a first layer and a second layer; and
each electric conductor includes a first conductor arranged in a blind-hole shape and a second conductor arranged in a semi-through-hole shape, the first conductor being disposed in the first layer and the second conductor being disposed between the first and second layer.

* * * * *